US010885242B2

United States Patent
Simic et al.

(10) Patent No.: US 10,885,242 B2
(45) Date of Patent: Jan. 5, 2021

(54) COLLISION DETECTION WITH ADVANCED POSITION

(71) Applicant: Microsoft Technology Licensing, LLC, Redmond, WA (US)

(72) Inventors: Milan Simic, Belgrade (RS); Eoin McLoughlin, Dublin (IE); Maxwell Simon Abernethy, San Francisco, CA (US); Nathanael Presson, Gyeonggi-do (KR); Nikola Nikolic, Belgrade (RS); Oliver M. Strunk, Munich (DE); Pavle Josipovic, Belgrade (RS); Petar Mitrovic, Belgrade (RS); Rory Mullane, Dublin (IE)

(73) Assignee: Microsoft Technology Licensing, LLC, Redmond, WA (US)

(*) Notice: Subject to any disclaimer, the term of this patent is extended or adjusted under 35 U.S.C. 154(b) by 413 days.

(21) Appl. No.: 15/870,624

(22) Filed: Jan. 12, 2018

(65) Prior Publication Data
US 2019/0065642 A1     Feb. 28, 2019

Related U.S. Application Data

(60) Provisional application No. 62/552,794, filed on Aug. 31, 2017.

(51) Int. Cl.
*G06F 30/20* (2020.01)
*G06F 30/17* (2020.01)

(52) U.S. Cl.
CPC .............. *G06F 30/20* (2020.01); *G06F 30/17* (2020.01)

(58) Field of Classification Search
CPC ........... G06F 30/20; G06F 30/17; G06F 30/12
(Continued)

(56) References Cited

U.S. PATENT DOCUMENTS

| 5,625,575 A * | 4/1997 | Goyal | G06F 30/20 |
| | | | 703/6 |
| 6,195,625 B1 * | 2/2001 | Day | G06F 30/15 |
| | | | 703/7 |

(Continued)

OTHER PUBLICATIONS

Ullman et al. (Mind Games: Game Engines as an Architecture for Intuitive Physics, 2017, Trends in Cognitive Science, pp. 1-12) (Year: 2017).*

(Continued)

*Primary Examiner* — Iftekhar A Khan
(74) *Attorney, Agent, or Firm* — Alleman Hall Creasman & Tuttle LLP

(57) ABSTRACT

A computing device, including a processor configured to execute a physics engine. The physics engine may, for a first body having a first position and a velocity vector, determine that a second position along the velocity vector is located outside a first non-collision region for the first body and a second body. The physics engine may determine a safe position along the velocity vector at which the first body would lie tangent to a first separation plane. The physics engine may determine an advanced position along the velocity vector between the safe position and the second position, and may determine an advanced separation plane. The advanced separation plane may have an advanced normal vector based on the advanced position. The physics engine may move the first body to a new position based on the velocity vector and the advanced separation plane.

20 Claims, 10 Drawing Sheets

(58) Field of Classification Search
USPC .......................................................... 703/2
See application file for complete search history.

(56) References Cited

U.S. PATENT DOCUMENTS

| | | | | |
|---|---|---|---|---|
| 7,616,204 B2* | 11/2009 | Muller | ...................... | G06T 13/20 345/419 |
| 8,223,144 B2* | 7/2012 | Ishiwata | ................. | G06T 19/00 345/419 |
| 8,548,776 B2* | 10/2013 | Rodyushkin | ............ | G06F 30/20 703/2 |
| 8,731,880 B2* | 5/2014 | Todorov | .................. | G06F 30/20 703/2 |
| 8,734,214 B2* | 5/2014 | Hughes | ................... | A63F 13/10 463/3 |
| 8,751,204 B2* | 6/2014 | Falash | ...................... | G09B 9/00 703/6 |
| 8,860,766 B2* | 10/2014 | Moravanszky | ......... | G06T 17/00 345/672 |
| 9,440,148 B2* | 9/2016 | Bond | ....................... | A63F 13/10 |
| 9,495,485 B2* | 11/2016 | Matsuike | .............. | A63F 13/577 |
| 9,589,383 B2* | 3/2017 | Mueller-Fischer | ...... | G06T 13/20 |
| 2002/0161562 A1* | 10/2002 | Strunk | .................... | G06T 13/20 703/6 |
| 2002/0180739 A1* | 12/2002 | Reynolds | ................ | G06T 17/20 345/474 |
| 2003/0112281 A1* | 6/2003 | Sriram | .................... | A63F 13/52 345/619 |
| 2003/0179205 A1* | 9/2003 | Smith | ..................... | G06F 30/20 345/474 |
| 2004/0053686 A1* | 3/2004 | Pacey | .................. | G07F 17/3211 463/25 |
| 2005/0075849 A1* | 4/2005 | Maher | ....................... | G06T 1/20 703/2 |
| 2005/0162433 A1* | 7/2005 | Tonge | ..................... | G06F 30/23 345/475 |
| 2005/0165874 A1* | 7/2005 | Zhang | ................. | G06F 15/8007 708/446 |
| 2005/0187742 A1* | 8/2005 | Collodi | ................... | G06F 30/20 703/2 |
| 2006/0149516 A1* | 7/2006 | Bond | ....................... | G06F 30/20 703/6 |
| 2008/0021679 A1* | 1/2008 | Bleiweiss | ................. | G06F 30/20 703/2 |
| 2009/0083015 A1* | 3/2009 | McDaniel | ............... | G06F 30/20 703/6 |
| 2012/0170800 A1* | 7/2012 | da Silva Frazao | ......................... G06K 9/00671 382/103 |
| 2012/0303343 A1* | 11/2012 | Sugiyama | .............. | G06N 3/006 703/6 |
| 2013/0120404 A1* | 5/2013 | Mueller | .................. | G06T 13/00 345/474 |
| 2013/0158966 A1* | 6/2013 | Baek | ....................... | G06T 13/20 703/6 |
| 2014/0244221 A1* | 8/2014 | Tonge | ..................... | G06F 30/20 703/2 |
| 2014/0244222 A1* | 8/2014 | Tonge | ..................... | G06F 30/20 703/2 |
| 2017/0344680 A1* | 11/2017 | Strunk | .................... | G06F 30/20 |
| 2019/0255442 A1* | 8/2019 | Broadway | .............. | A63F 13/56 |

OTHER PUBLICATIONS

Redon et al. (Fast Continuous Collision Detection between Rigid Bodies, EUROGRAPHICS, 2002, pp. 2-10) (Year: 2002).*

Jeremy Ulrich (Rigid Body Simulation, 2013, pp. 1-12) (Year: 2013).*

Ullmana et al. ("Mind Games: Game Engines as an Architecture for Intuitive Physics", Harvard University, 2017, pp. 1-11) (Year: 2017).*

"Smooth Movement over Triangle Mesh", Retrieved From <<http://digitalrune.github.io/DigitalRune-Documentation/html/cb1a3d03-4603-4086-aaea-f91de81e7d8a.htm>>, Mar. 10, 2016, 4 Pages.

Chong, Kah Shiu, "Collision Detection Using the Separating Axis Theorem", Retrieved From <<https://gamedevelopment.tutsplus.com/tutorials/collision-detection-using-the-separating-axis-theorem--gamedev-169>>, Aug. 6, 2012, 48 Pages.

Fairfax, et al., "Augmented Reality Ball Game", Retrieved From <<http://people.ece.cornell.edu/land/courses/ece5760/FinalProjects/s2013/cwf38_as889_mao65/>>, Dec. 2, 2016, 11 Pages.

Payne, Paul, "Simple Collision Detection", Retrieved From <<http://relativity.net.au/gaming/java/SimpleCollisionDetection.html>>, Feb. 25, 2013, 4 Pages.

Redon, et al., "Fast continuous collision detection between rigid bodies", In Journal of Computer Graphics Forum, vol. 21, Issue 3, Sep. 1, 2002, 10 Pages.

Tang, et al., "CCQ: Efficient Local Planning Using Connection Collision Query", In Algorithmic Foundations of Robotics IX—Selected Contributions of the Ninth International Workshop on the Algorithmic Foundations of Robotics, Dec. 13, 2010, pp. 1-16.

Wang, et al., "TightCCD: Efficient and Robust Continuous Collision Detection using Tight Error Bounds", In Proceedings of 23rd Pacific Conference on Computer Graphics and Applications, vol. 34, Issue 7, Oct. 7, 2015, 11 Pages.

Zhang, et al., "Continuous Collision Detection for Articulated Models using Taylor Models and Temporal Culling", In Journal of ACM Transactions on Graphics, vol. 26, Issue 3, Jul. 2007, 11 Pages.

* cited by examiner

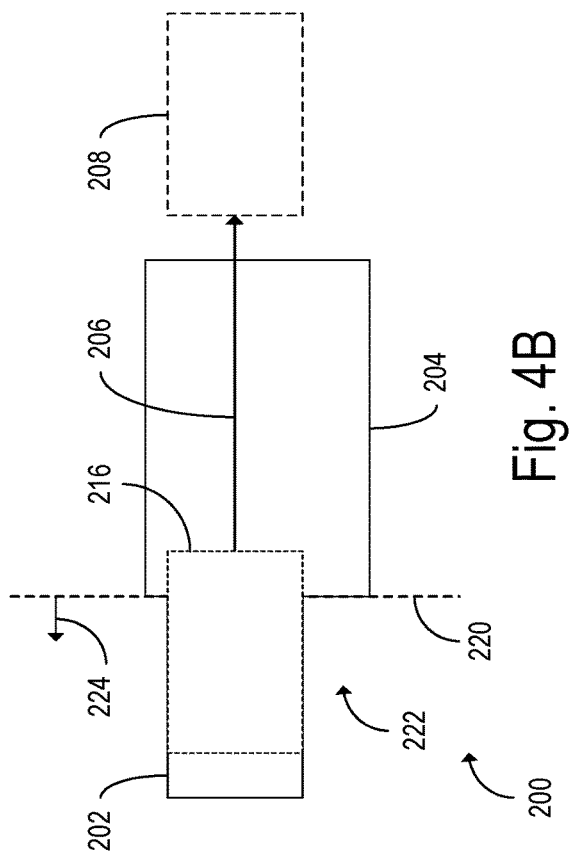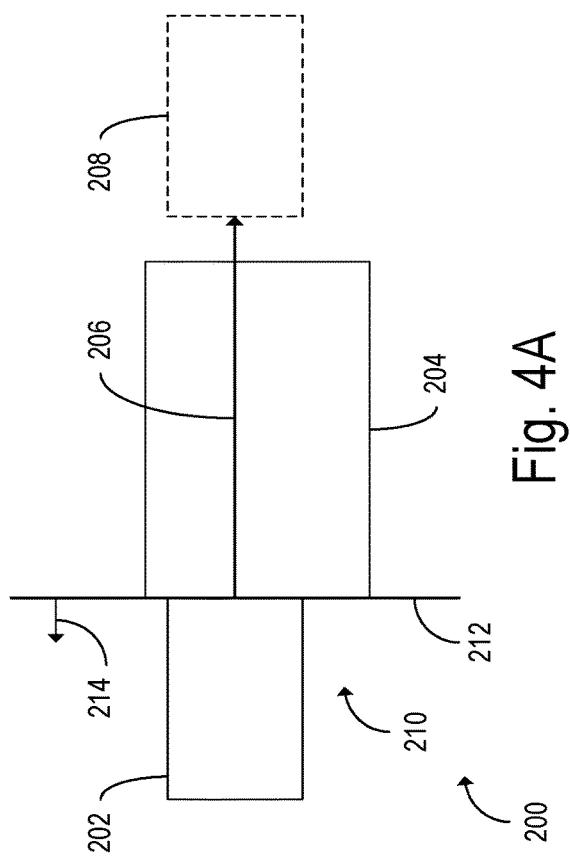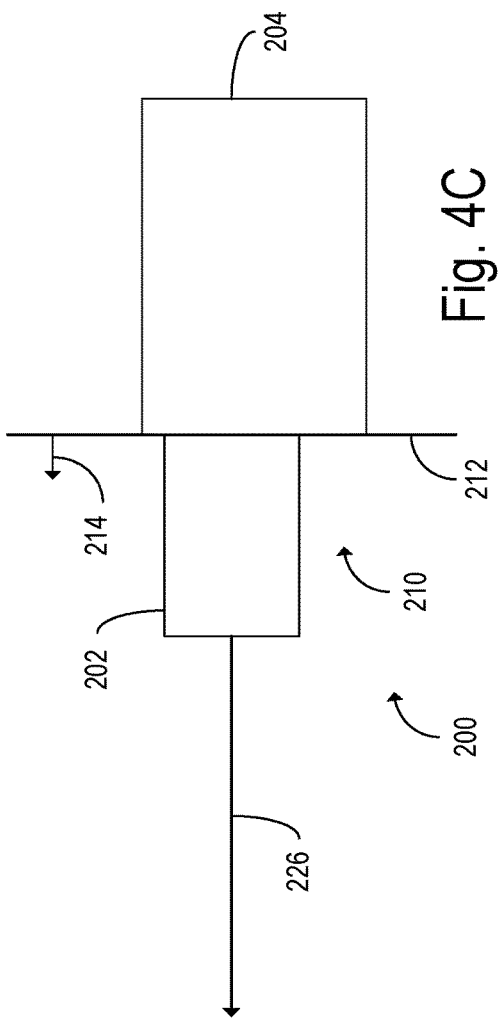

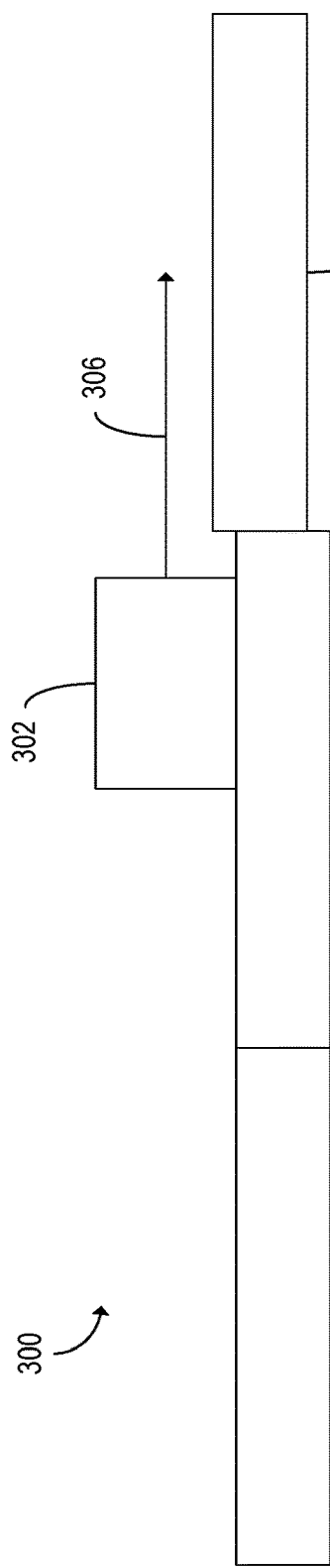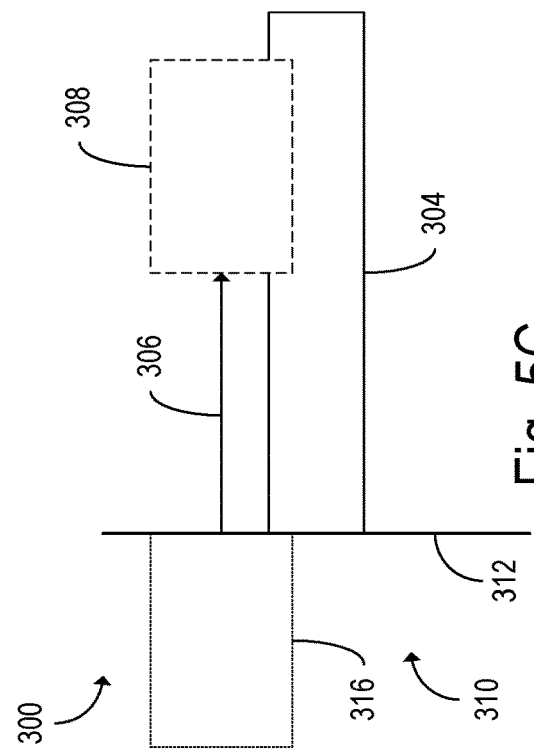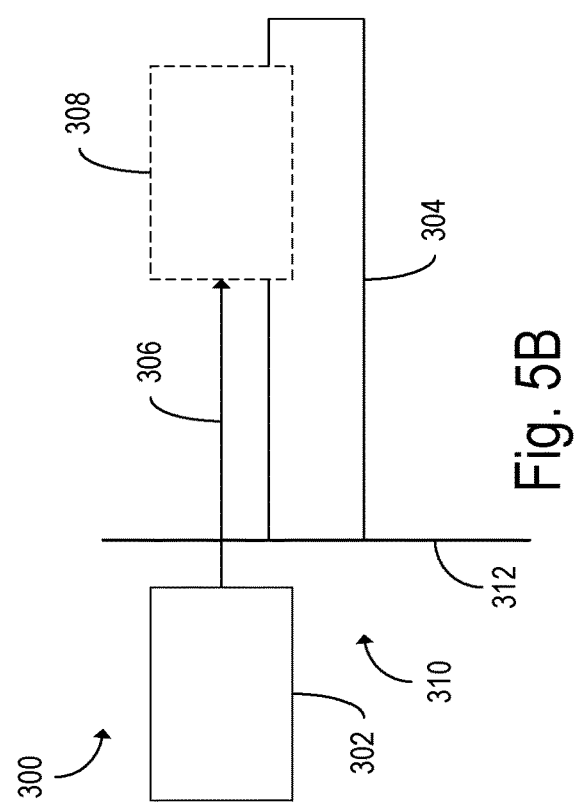
Fig. 5A
Fig. 5B
Fig. 5C

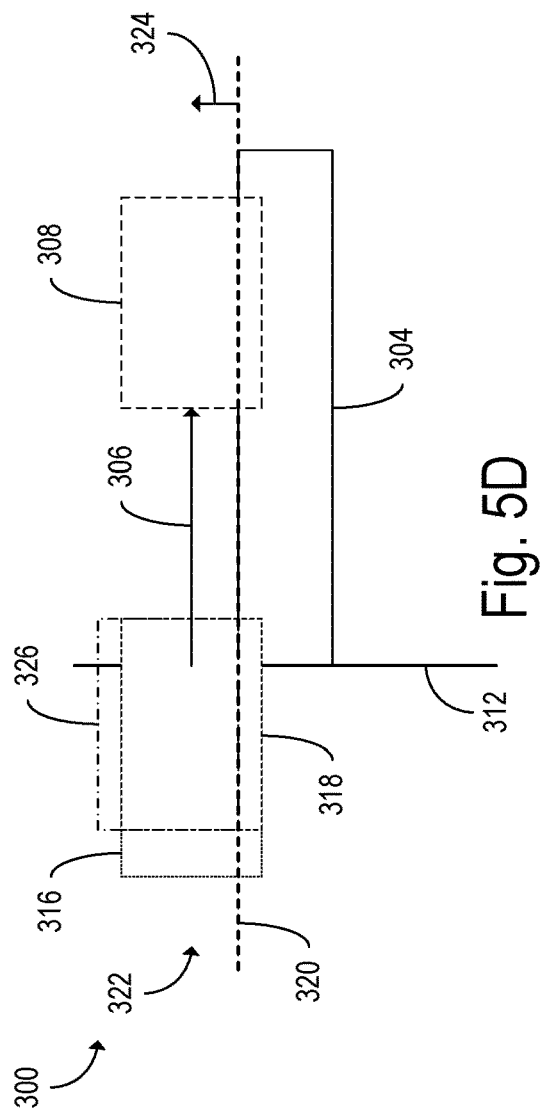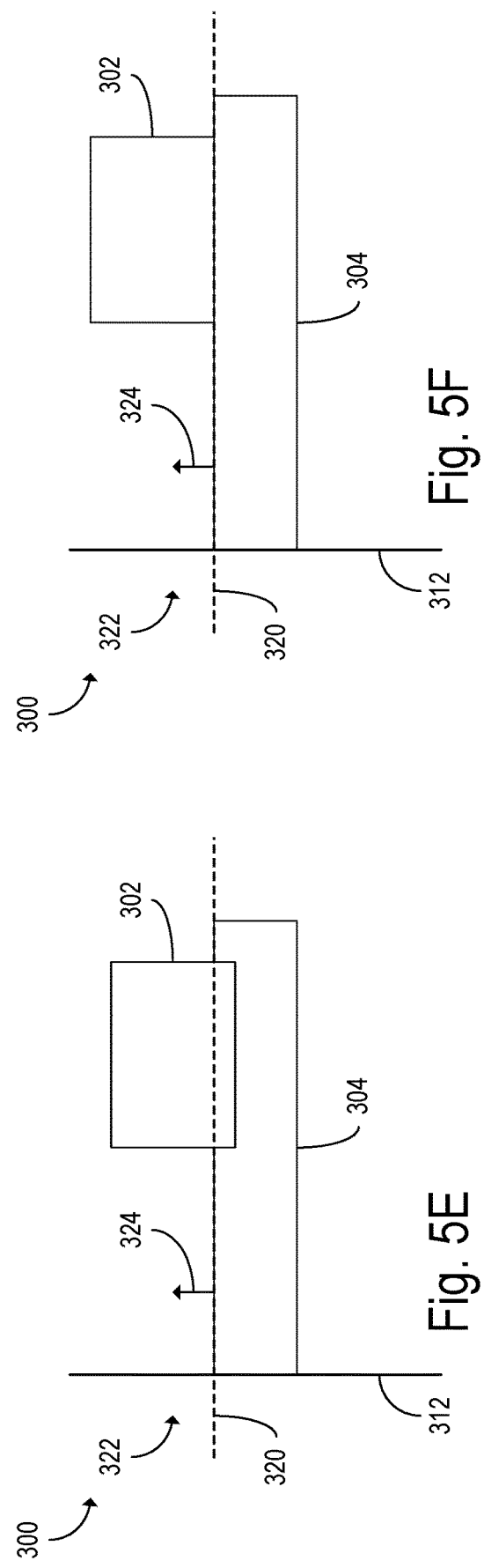

US 10,885,242 B2

COLLISION DETECTION WITH ADVANCED POSITION

CROSS REFERENCE TO RELATED APPLICATIONS

This application claims priority to U.S. Provisional Patent Application Ser. No. 62/552,794, filed Aug. 31, 2017, the entirety of which is hereby incorporated herein by reference for all purposes.

BACKGROUND

Many computer applications (e.g. video games) utilize physics engines to simulate physical systems including rigid bodies. Simulating a physical system including rigid bodies typically involves determining whether pairs of rigid bodies collide. Such determinations are typically made by using non-collision regions for pairs of bodies to indicate non-collision regions where further collision checking is not necessary. However, when a body in a pair is detected to be outside the non-collision region, the physics engine typically performs additional steps to determine whether the bodies collide and how the positions of the bodies may be changed. In existing physics engines, these additional steps may consume large amounts of computing resources (e.g. processing and/or memory), especially in simulated physical systems including large numbers of bodies. Heavy use of computing resources by the physics engine may result in lag and/or non-smooth movement of bodies, which may negatively affect the user experience. In addition, existing methods for reducing the use of computing resources when detecting collisions may result in false-positive collision detections.

SUMMARY

According to one aspect of the present disclosure, a computing device is provided, comprising a processor configured to execute a physics engine to simulate real-time rigid body dynamics of a simulated physical system including a plurality of bodies. The physics engine may be configured to, for a first body of the plurality of bodies, wherein the first body is located at a first position and has a movement direction indicated by a velocity vector, determine that a second position located along the velocity vector is located outside a first non-collision region for the first body and a second body of the plurality of bodies. The physics engine may be further configured to determine a safe position located along the velocity vector at which the first body would lie tangent to a first separation plane that bounds the first non-collision region on a first side. The physics engine may be further configured to determine an advanced position located along the velocity vector between the safe position and the second position. The physics engine may be further configured to determine an advanced separation plane that bounds an advanced non-collision region on an advanced side. The advanced separation plane may have an advanced normal vector based at least in part on the advanced position. The physics engine may be further configured to move the first body to a new position based at least in part on the velocity vector and the advanced separation plane.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 4A shows another example of a simulated physical system including a first body and a second body, according to the embodiment of FIG. 1.

FIG. 4B shows an advanced position for the first body of the example simulated physical system of FIG. 4A.

FIG. 4C shows the simulated physical system of FIG. 4A, where the first body has a bounced velocity vector.

FIG. 5A shows an example of a simulated physical system including a first body moving along the surface of other bodies, according to the embodiment of FIG. 1.

FIG. 5B shows the first body and the second body of the simulated physical system of FIG. 5A.

FIG. 5C shows a safe position for the first body of the example simulated physical system of FIG. 5A.

FIG. 5D shows an advanced position and a second safe position for the first body of the example simulated physical system of FIG. 5A.

FIG. 5E shows the simulated system of FIG. 5A, where the first body is moved to a new position at which it penetrates the second body.

FIG. 5F shows the simulated system of FIG. 5E, where an estimated correction for the penetration has been applied to the first body.

DETAILED DESCRIPTION

Figure 1:
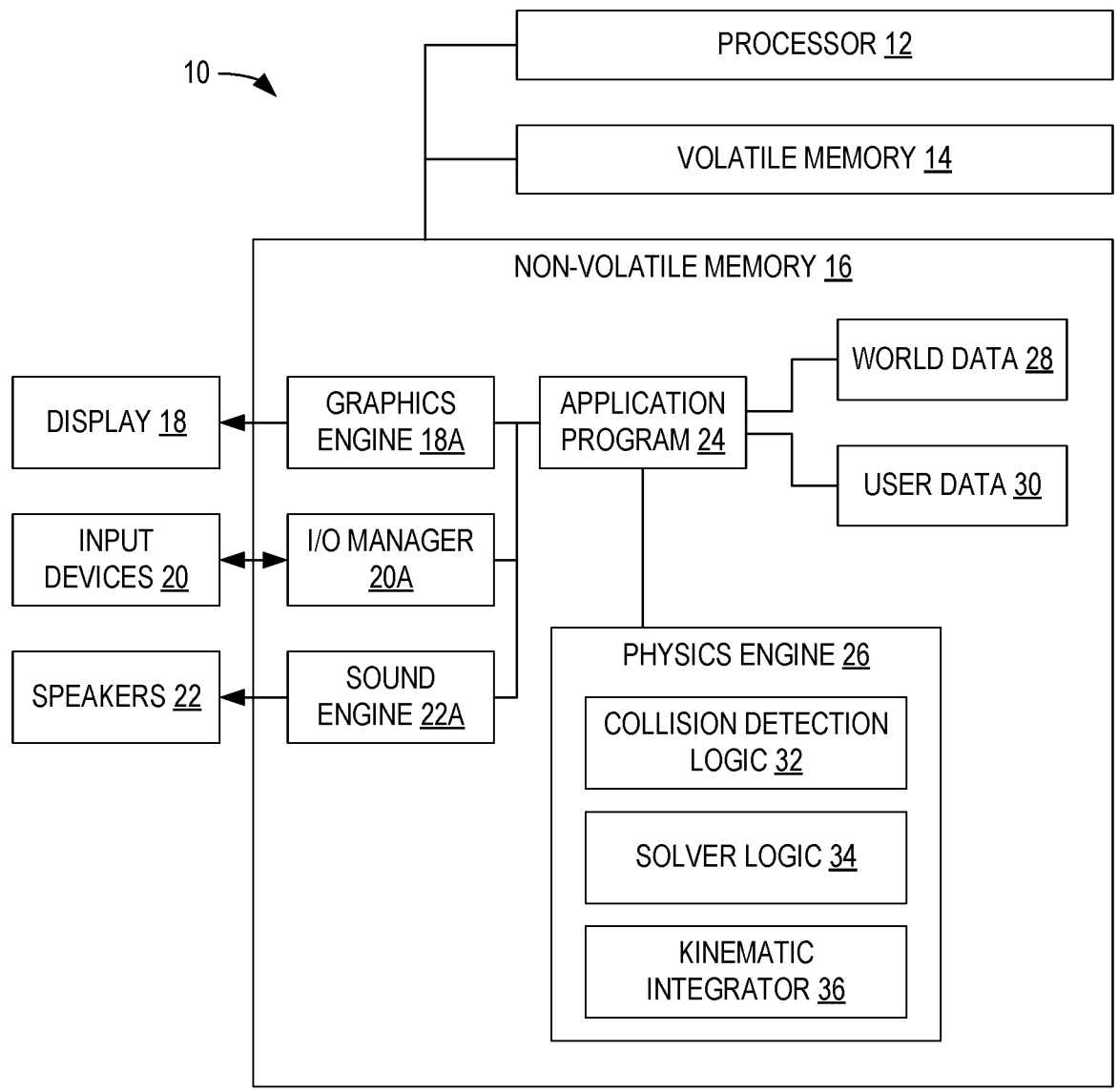
FIG. 1 shows a computing device including a processor configured to execute a physics engine to simulate the real-time dynamics of a simulated physical system including a plurality of bodies, according to one embodiment of the present disclosure.

FIG. 1 illustrates a computing device 10 configured with a physics engine 26 having collision detection features, according to one embodiment of the present disclosure. Computing device 10 includes a processor 12, volatile memory 14 such as RAM, non-volatile memory 16 such as a hard disk or FLASH memory, a display 18, input devices 20 such as a mouse, keyboard, touchscreen, etc., and one or more speakers 22. The processor 12 is configured to execute various software programs, such as application program 24, which are stored in non-volatile memory 16, using portions of volatile memory 14. Drivers such as a graphics engine 18A, an I/O manager 20A, and sound engine 22A enable communication between application program 24 and the display 18, input devices 20 and speakers 22, respectively. Application program 24 may be a computer game, or virtually any other type of program that utilizes a physics engine 26 that simulates real-time rigid body dynamics in response to user inputs and program logic.

Application program 24 is configured to utilize, and processor 12 is configured to execute, a physics engine 26 to simulate the real-time rigid body dynamics of a simulated physical system including a plurality of bodies. Data representing these physical bodies is stored as world data 28 and user data 30. At a high level, the physics engine 26 includes collision detection logic 32, solver logic 34, and a kinematic integrator 36, which are applied iteratively by the physics engine 26 to adjust the positions and velocities of various bodies in the physical system in order to make them behave appropriately under applied forces, such as gravity, wind resistance, springs, magnetism, etc., as well as observe physical constraints, such as non-penetration of other rigid bodies, joint constraints, etc. Collision detection logic 32, solver logic 34, and kinematic integrator 36 are typically software programs executed by the processor 12, which may be a multi-threaded and possibly multi-core central processing unit (CPU). However, in some embodiments portions or all of the logic of the physics engine 26 described herein may be implemented in firmware or hardware, for example on a graphical processing unit (GPU).

Figure 2:
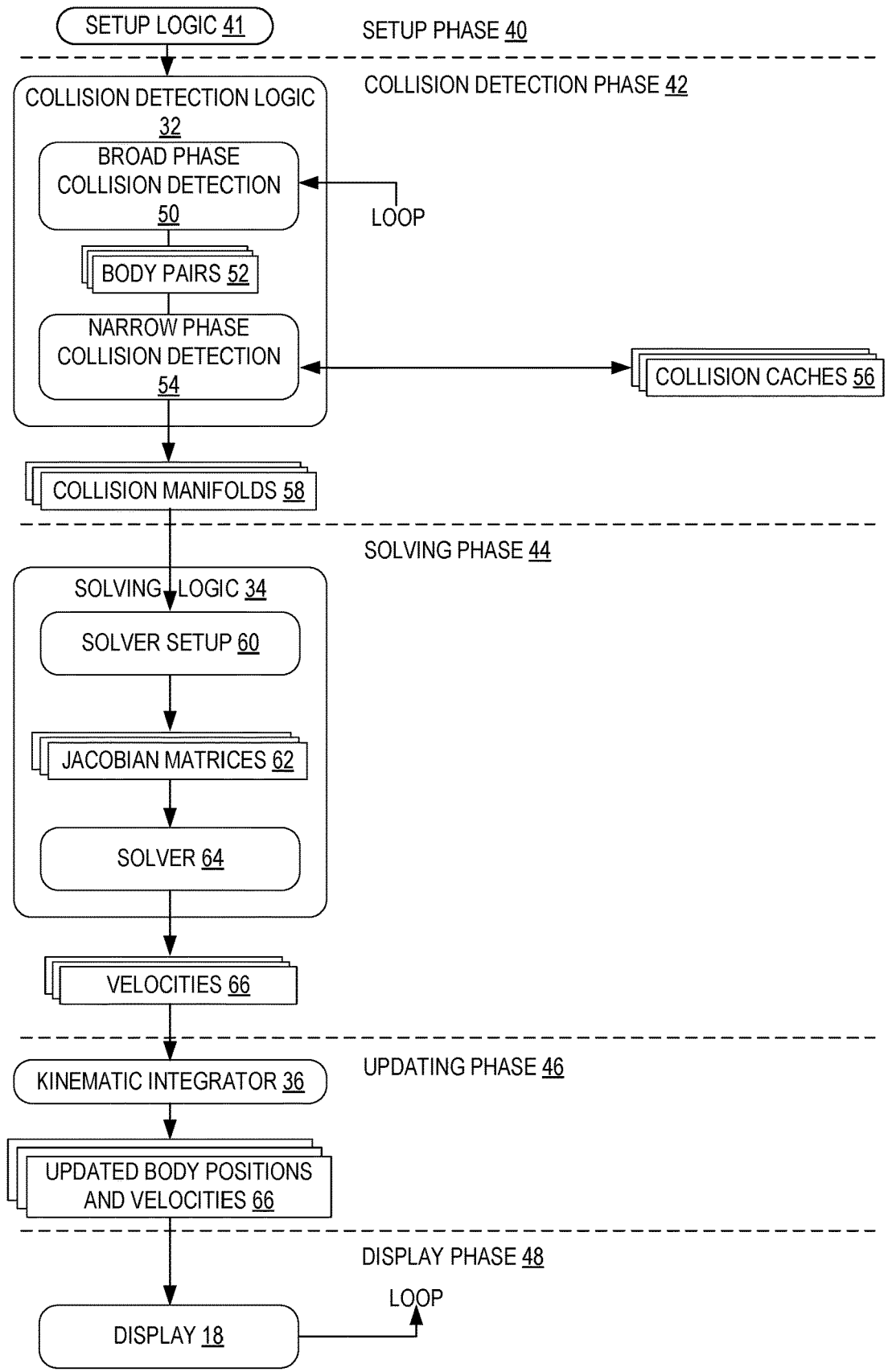
FIG. 2 shows a process flow that may be implemented by the computing device of FIG. 1 for executing the physics engine.

FIG. 2 illustrates an example embodiment of a real-time rigid body simulation by the physics engine 26, which substantially enforces non-penetration of bodies in the system. As shown in FIG. 2, the simulation begins with a setup phase 40 implemented by setup logic 41 executed on processor 12, in which the bodies and their positions, orientations and velocities are initially set prior to kinematic simulation. Following the setup phase 40, the simulation enters into a loop, during which a collision detection phase 42 and a solving phase 44 are iteratively executed by the collision detection logic 32 and solver logic 34 respectively. During the collision detection phase 42, contact information for touching bodies is generated, and during the solving phase 44 the system of body velocities and constraints imposed by contacts are computed. At the end of the solving phase 44, the forces are applied to the bodies. The positions and velocities of the bodies are updated in an updating phase 46. The resulting graphical representation of the updated positions of the bodies is displayed in a display phase 48. Once the results are displayed, the process loops back to the collision detection phase 42. These phases will now be explained in more detail.

The collision detection phase 42 generates contact points between any touching or nearly touching rigid bodies. Typically, the contact points are generated by a broad collision detection phase 50 which finds pairs 52 of potentially colliding bodies and a narrow collision detection phase 54 which generates contact information for each pair 52 and stores it in a collision manifold 58. The collision manifold 58 is a data structure designed to hold data regarding each collision between a pair of bodies 52. The contact information stored in the collision manifold 58 may include a separating normal vector, any number of contact point positions and their penetrating or separating distances. Some narrow phase working data is cached in collision caches 56 and reused in subsequent simulation steps.

The solving phase 44 implemented by solver logic 34 first generates a set of mathematical constraints (known as Jacobian matrices or simply Jacobians) based on the generated contact manifolds. Solver setup 60 includes converting the position and velocity data for the rigid bodies into Jacobian matrices 62, which may be processed in a computationally efficient manner in real time by the solver 64. The constraints are velocity-based, meaning that they are constraints on the velocities of the two contacting bodies. The solver 64 then solves for the body velocities 66 and constraints and finally applies the resulting impulses or forces to the bodies.

In real-time physics engines such as physics engine 26, it may be too computationally expensive to solve an unbounded system of constraints simultaneously. Instead, an iterative algorithm is employed by the solver 64, such as the Projected Gauss Seidel (PGS) algorithm. Rather than solving all constraints at once, PGS iteratively solves each constraint in turn so that the solver 64 converges towards to a stable solution. It will be appreciated that other algorithms may also be used instead of PGS, such as modified versions of the PGS, the Jacobi method, etc.

Bodies may penetrate during rigid-body simulation, due to the imperfect nature of iterative solving and due to accumulated numerical precision errors. When bodies are penetrating, contact points generated between them have a negative distance. To get good stability of such an iterative solver, those penetrations are preferably solved in a single simulation frame. If they are solved over many (e.g. >10) simulation frames, the bodies may penetrate visually.

Physics engine 26 may use velocity adjustment or position adjustment to solve penetrations. Adjusting the relative velocity may be achieved by modifying a contact constraint equation by introducing a velocity bias. This bias may be set proportional to the penetration depth, employing a technique known as Baumgarte stabilization. For example, the bias may be set to solve a proportional fraction such as 60% (or other percentage) of the penetration depth every solver step. Adjusting the relative position may alternatively be achieved by running a post-processing algorithm after the solver completes its calculations which repositions the pair of bodies 52 in the simulated physical system. The repositioning may be done iteratively, such that each pair of bodies 52 is solved independently and sequentially.

Figure 3A:
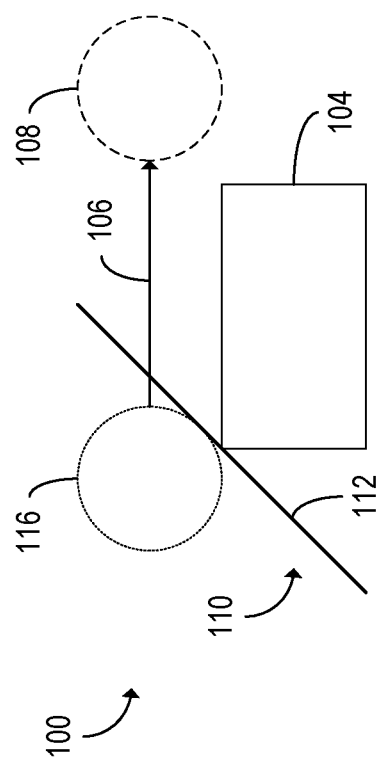
FIG. 3A shows an example simulated physical system including a first body and a second body, according to the embodiment of FIG. 1.

FIGS. 3A-3F show an example of a simulated physical system 100 simulated by the physics engine 26, according to the embodiment of FIGS. 1 and 2. The simulated physical system 100 may be a region of interest defined by a collision detection boundary, wherein the physics engine 26 is configured to detect collisions between bodies within the region of interest. FIG. 3A depicts a first body 102 and a second body 104 of a plurality of bodies. The first body 102 is located at a first position and has a movement direction indicated by a velocity vector 106. FIG. 3A also shows a first non-collision region 110 for the first body 102 and the second body 104. The physics engine 26 may use the first non-collision region 110 to determine that the first body 102 is not colliding with the second body 104 as long as the first body 102 is within the first non-collision region 110. The physics engine 26 demarcates the first non-collision region 110 with a first separation plane 112 that bounds the first non-collision region 110 on a first side. The first separation plane 112 may divide the bounded region of interest in which the collision is being detected into two half spaces, the object-side one of which is the first non-collision region 110. The first separation plane 112 may be specified at least in part by a normal vector 114.

Although only two bodies are depicted in the simulated physical system 100 of FIG. 2, the simulated physical system would include more than two bodies in most implementations. When the simulated physical system includes more than two bodies, collision detection may be performed for each possible pair of bodies 52, or alternatively for only some of the possible pairs of bodies 52.

In order to prevent the first separation plane 112 from passing through the first body 102 or the second body 104, the first body 102 and the second body 104 may be convex. To ensure this, an entry condition to the techniques described herein may be to determine that the first body 102 and second body 104 within the region of interest defined by the collision detection boundary are both convex. The physics engine 26 may be configured to divide at least one concave body into a plurality of convex bodies, so that the techniques herein may be applied. This division may occur during the setup phase 40 of FIG. 2.

The physics engine 26 is further configured to determine a second position 108 for the first body 102. The second position 108 is typically a position to which the first body 102 would move in the time step following the current time step if the first body 102 does not undergo any collisions. The second position 108 is located along the velocity vector 106 of the first body 102, and may be equal to the first position plus the velocity vector 106 multiplied by a time step length.

Figure 3B:
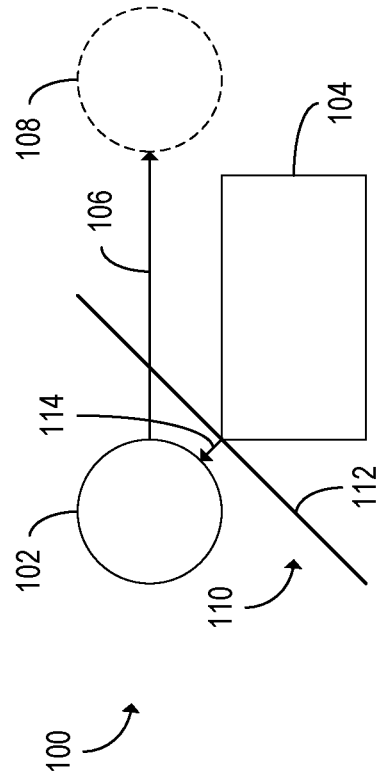
FIG. 3B shows a safe position for the first body of the example simulated physical system of FIG. 3A.

The physics engine 26 is further configured to determine that the second position 108 is located outside the first non-collision region 110. The physics engine 26 may be configured to determine that the first body 102 would cross the first separation plane 112 if it were to move to the second position 108. Then, as shown in FIG. 3B, the physics engine 26 is further configured to determine a safe position 116 located along the velocity vector 106 at which the first body 102 would lie tangent to the first separation plane 112. In other embodiments, the physics engine 26 may determine a safe position 116 located along the velocity vector 106 at which the first body 102 would be located at a threshold distance from the first separation plane 112.

Figure 3C:
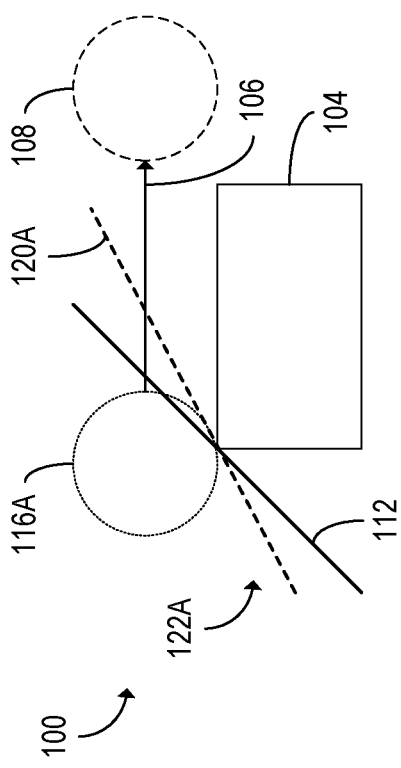
FIG. 3C shows a safe position and an advanced separation plane for the first body of the example simulated physical system of FIG. 3A when the conventional technique of conservative advancement is used.
Figure 3D:
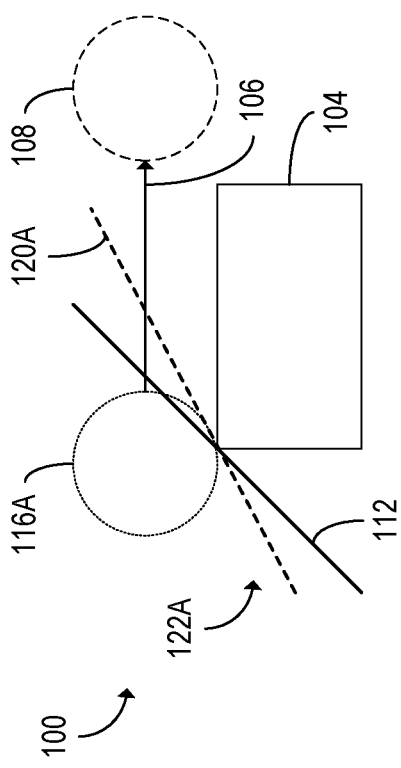
FIG. 3D shows a second safe position and an advanced separation plane for the first body of the example simulated physical system of FIG. 3A when the conventional technique of conservative advancement is used.

A conventional technique known as conservative advancement, as well as the shortcomings of said technique, are described below. FIGS. 3C and 3D show the simulated physical system 100 of FIGS. 3A and 3B when conservative advancement is used. In conservative advancement, a first separation plane 112 between a first body 102 and a second body 104 of a plurality of bodies is determined, and a safe position 116 is determined for the first body 102 based on the first separation plane 112. Once the safe position 116 has been determined, the physics engine 26 determines whether the first body 102 is in contact with the second body 104. The physics engine 26 may determine whether the first body 102 is in contact with the second body 104 by determining whether the distance between the first body 102 and the first separation plane 112 is below a threshold distance. If the first body 102 is determined to be in contact with the second body 104, the physics engine 26 may then cause the first body 102 to bounce off the second body 104. If the first body 102 is not in contact with the second body 104, as shown in FIG. 3C, the physics engine 26 determines a second non-collision region 122A bounded by a second separation plane 120A. The physics engine 26 then determines a second safe position 116A at which the first body 102 would lie tangent to the second separation plane 120A, as shown in FIG. 3D. The physics engine 26 iteratively loops through calculating separation planes, calculating safe positions, and checking whether a bounce occurs.

However, conservative advancement may require many iterations to determine whether the first body 102 collides with the second body 104, especially when one or both of the first body 102 and the second body 104 has a rounded surface. Thus, conservative advancement may be computationally resource-intensive. In order to allow conservative advancement to be performed in real time, the number of iterations is typically capped. When the number of iterations reaches the cap, if the distance between the first body 102 and the separation plane is small but nonzero, a bounce may occur even if the first body 102 and the second body 104 do not collide. Using conservative advancement may therefore result in non-smooth movement of the first body 102.

Figure 3F:
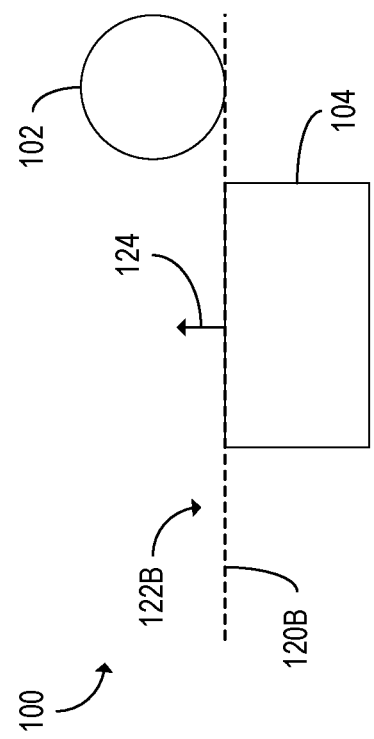
FIG. 3F shows the simulated physical system of FIG. 3A, where the first body has been moved to a new position.
Figure 3E:
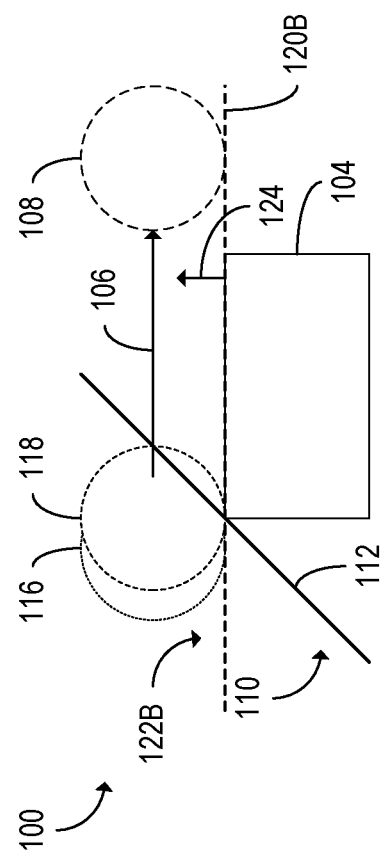
FIG. 3E shows an advanced position for the first body of the example simulated physical system of FIG. 3A.

In view of the shortcomings of conservative advancement, an improved technique is depicted in FIG. 3E. As shown in FIG. 3E, the physics engine 26 is further configured to determine an advanced position 118 located along the velocity vector 106 between the safe position 116 and the second position 108. In some embodiments, the advanced position 118 may be located at an advancement distance from the safe position 116 based at least in part on a radius of the first body 102. If the first body 102 is not circular or spherical, an average radius, minimum radius, or maximum radius of the first body 102 may be used. In some embodiments, the advancement distance may be between 10% and 50% of the radius of the first body 102.

The physics engine 26 is further configured to determine an advanced separation plane 120B that bounds an advanced non-collision region 122B on an advanced side. The advanced separation plane 120B has an advanced normal vector 124 based at least in part on the advanced position 118. In some embodiments, the physics engine 26 may determine the advanced non-collision region 122B such that the advanced position 118 is within the advanced non-collision region 122B. In some embodiments, the physics engine 26 may rotate the first separation plane 112 about the advanced position 118 in order to determine the advanced separation plane 120B. This may allow for smoother movement of the first body 102 while not introducing interpenetrations of the first body 102 and the second body 104 that would not have occurred when using conservative advancement.

Finally, the physics engine 26 is further configured to move the first body 102 to a new position based at least in part on the velocity vector 106 and the advanced separation plane 120B. In some embodiments, the second position 108 may be within the advanced non-collision region 122B, and the new position to which the first body 102 is moved may be the second position 108. FIG. 3F shows the simulated physical system 100 when the first body 102 is moved to the second position 108.

FIGS. 4A-4C show another example of a simulated physical system 200, according to the embodiment of FIGS. 1 and 2. FIG. 4A shows a first body 202 and a second body 204 at a current time step. The first body 202 is located at a first position and has a velocity vector 206. In the example of FIGS. 4A-4C, the physics engine 26 determines whether to move the first body 202 to a second position 208 at a time step following the current time step. The second position 208 may be equal to the first position plus the velocity vector 206 multiplied by a time step length. The physics engine 26 determines that moving the first body 202 to the second position 208 would cause the first body 202 to cross a first separation plane 212 and leave a first non-collision region 210. The first separation plane 212 may have a normal vector 214. Since the first body 202 already lies tangent to the first separation plane 212, the safe position of the first body 202 is the first position.

As shown in FIG. 4B, the physics engine 26 determines an advanced position 216 of the first body 202. The physics engine 26 also determines an advanced separation plane 220 that bounds an advanced non-collision region 222. The advanced separation plane 220 may be specified at least in part by an advanced normal vector 224. As shown in FIG. 4B, since the safe position of the first body 202 is the same as the first position, the advanced non-collision region 222 is the same as the first non-collision region 210, and the advanced separation plane 220 is the same as the first separation plane 212. However, the physics engine 26 detects a penetration of the second body 204 by the first body 202 when the first body 202 is located at the advanced position 216. In this implementation, instead of moving the first body 202 to the second position 208, the physics engine 26 instead causes the first body 202 to bounce off the second body 204. As shown in FIG. 4C, the physics engine 26 is further configured to generate a bounced movement direction for the first body 202, wherein the bounced movement direction is indicated by a bounced velocity vector 226. The bounced velocity vector 226 may be generated by reflecting the velocity vector 206 of the first body 202 across the advanced normal vector 224 of the advanced separation plane 220 and reversing a direction of the reflected velocity vector. Alternatively, the bounced velocity vector 226 may be generated in some other way, for example, to simulate an inelastic collision.

FIGS. 5A-5F show another example of a simulated physical system 300, according to the embodiment of FIGS. 1 and 2. In the simulated physical system 300 of FIGS. 5A-5F, a first body 302 is moving along a surface of other bodies, as shown in FIG. 5A. For example, the first body 302 may represent a character moving along the ground in a video game. The first body 302 has a velocity vector 306. A second body 304 of the surface is located at a slightly elevated position relative to the other bodies of the surface, and therefore may collide with the first body 302. The slight elevation of the second body 304 may occur, for example, due to error in placement of the bodies during creation of the simulated physical system 300.

FIG. 5B shows the first body 302, the second body 304, and a second position 308 to which the first body 302 may be moved. In addition, FIG. 5B shows a first separation plane 312 between the first body 302 and the second body 304 that indicates a non-collision region 310. If the first body 302 were moved to the second position 308, the first body 302 would cross the first separation plane 312. FIG. 5C shows a safe position 316, located along the velocity vector 306, at which the first body 302 would lie tangent to the first separation plane 312.

In FIG. 5D, an advanced position 318 located along the velocity vector 306 between the safe position 316 and the second position 308 is shown. The physics engine 26 then detects a penetration of the second body 304 by the first body 302 when the first body 302 is located at the advanced position 318. However, unlike in the example of FIGS. 4A-4C, the physics engine 26 may allow the penetration of the second body 304 by the first body 302. For example, the physics engine 26 may determine an advanced separation plane 320 that lies tangent to the first body 302 when the first body 302 is located at the advanced position 318, and may determine that a portion of the second body 304 located in an advanced non-collision region 322 defined by the advanced separation plane 320 is below a predetermined size threshold. Based on such a determination, the physics engine 26 may allow the penetration. Allowing the penetration of the second body 304 by the first body 302 may result in smoother movement of the first body 302 by allowing the physics engine 26 avoid sudden changes in the height of the first body 302 that may be noticed by a user and may negatively affect the user experience.

In some embodiments, when the physics engine 26 determines that the first body 302 penetrates the second body 304, the physics engine 26 may determine the advanced separation plane 320 at least in part by determining a second safe position 326. The second safe position 326 may be a position of the first body 302 closest to the advanced position 318 at which the first body 302 would not penetrate the second body 304. The physics engine 26 may then determine the advanced separation plane 320 that would lie tangent to the first body 302 and the second body 304 when the first body 302 is located at the second safe position 326. The advanced separation plane 320 may have an advanced normal vector 324 that points in a direction from the advanced position 318 to the second safe position 326.

When the physics engine 26 allows the penetration of the second body 304 by the first body 302 when the first body 302 is located at the advanced position 318, the physics engine 26 may move the first body 302 to the second position 308. In FIG. 5E, the first body 302 is shown after having been moved to the second position 308. When located at the second position 308, the first body 302 penetrates the second body 304. The physics engine 26 may be further configured to apply a bias or a position change to the first body 302 or the second body 304 as an estimated correction for the penetration. FIG. 5F shows the simulated physical system 300 after a position change has been applied to the first body 302 so that the first body 302 no longer penetrates the second body 304. In some embodiments, the bias or position change may be applied to the first body 302 in a single time step in order to reduce an amount of time for which the first body 302 penetrates the second body 304. In other embodiments, the bias or position change may be applied over a plurality of time steps so that the first body 302 moves more smoothly. As shown in FIG. 5F, applying the bias or position change may include moving the first body 302 so that the first body 302 lies tangent to the advanced separation plane 320. The physics engine 26 may apply the bias or position change by moving the first body 302 along the advanced normal vector 324 of the advanced separation plane 320. In some embodiments, the bias may be a velocity bias, which may be proportional to the penetration depth. Although FIG. 5F shows the simulated physical system 300 after the bias or position change has been applied to the first body 302, the bias or position change may additionally or alternatively be applied to the second body 304.

Although, in the example embodiments of FIGS. 3-5, the first body moves while the second body remains stationary, embodiments in which the second body moves while the first body remains stationary, or in which both the first body and the second body move, are also contemplated. In addition, collision detection may be performed for new pairs of bodies when bodies are added to the region of interest. Data associated with bodies may also be deleted when those bodies are removed from the region of interest.

In addition, each of the examples of FIGS. 3-5 shows only one iteration of determining a safe position, an advanced position, and an advanced separation plane. However, implementations in which more than one iteration is performed are also contemplated.

Figure 6:
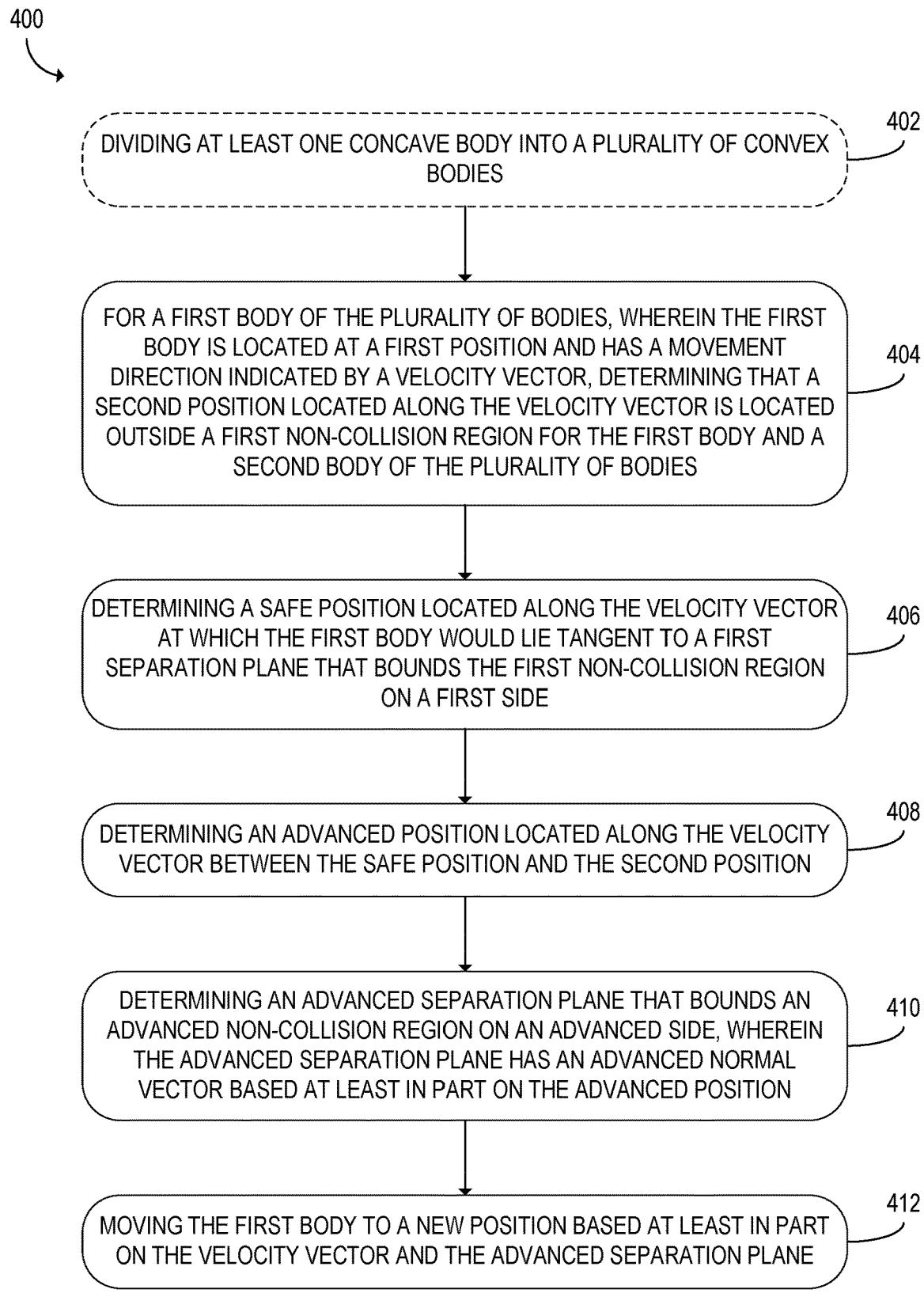
FIG. 6 shows a flowchart of an example method for executing a physics engine, according to one embodiment of the present disclosure.

FIG. 6 shows a flowchart of an example method 400 for executing a physics engine to simulate real-time rigid body dynamics of a simulated physical system including a plurality of bodies. The method 400 of FIG. 6 may be performed using the computing device of FIG. 1. The method 400 may include, at step 404, for a first body of the plurality of bodies, wherein the first body is located at a first position and has a movement direction indicated by a velocity vector, determining that a second position located along the velocity vector is located outside a first non-collision region for the first body and a second body of the plurality of bodies. The first non-collision region may be indicated by a first separation plane that bounds the first non-collision region on a first side. The first separation plane may be specified at least in part by a normal vector. The second position may be equal to the first position plus the velocity vector multiplied by a time step length, and may be a position to which the first body would move in a subsequent time step if the first body did not undergo any collisions.

In order to avoid having the first separation plane penetrate the first body and/or the second body, the first body and the second body are preferably convex. At step 402, the method 400 may include, as an entry condition, dividing at least one concave body into a plurality of convex bodies.

Continuing with the method 400, the method 400 may further include, at step 406, determining a safe position located along the velocity vector at which the first body would lie tangent to the first separation plane. In other embodiments, the safe position may instead be located at a threshold distance from the first separation plane.

The method 400 may further include, at step 408, determining an advanced position located along the velocity vector between the safe position and the second position. In some embodiments, the advanced position may be located at an advancement distance from the safe position based at least in part on a radius of the first body. The radius used to determine the advanced position may be, for example, an average radius, a minimum radius, or a maximum radius. In some embodiments, the advancement distance may be between 10% and 50% of the radius of the first body.

At step 410, the method 400 may further include determining an advanced separation plane that bounds an advanced non-collision region on an advanced side. The advanced separation plane may have an advanced normal vector based at least in part on the advanced position. The advanced separation plane may be determined by rotating the first separation plane about the advanced position. In some embodiments, the second position may be within the advanced non-collision region. At step 412, the method 400 may further include moving the first body to a new position based at least in part on the velocity vector and the advanced separation plane. In some implementations, the new position may be the second position. In other implementations, the first body may not be allowed to move to the second position.

Figure 7:
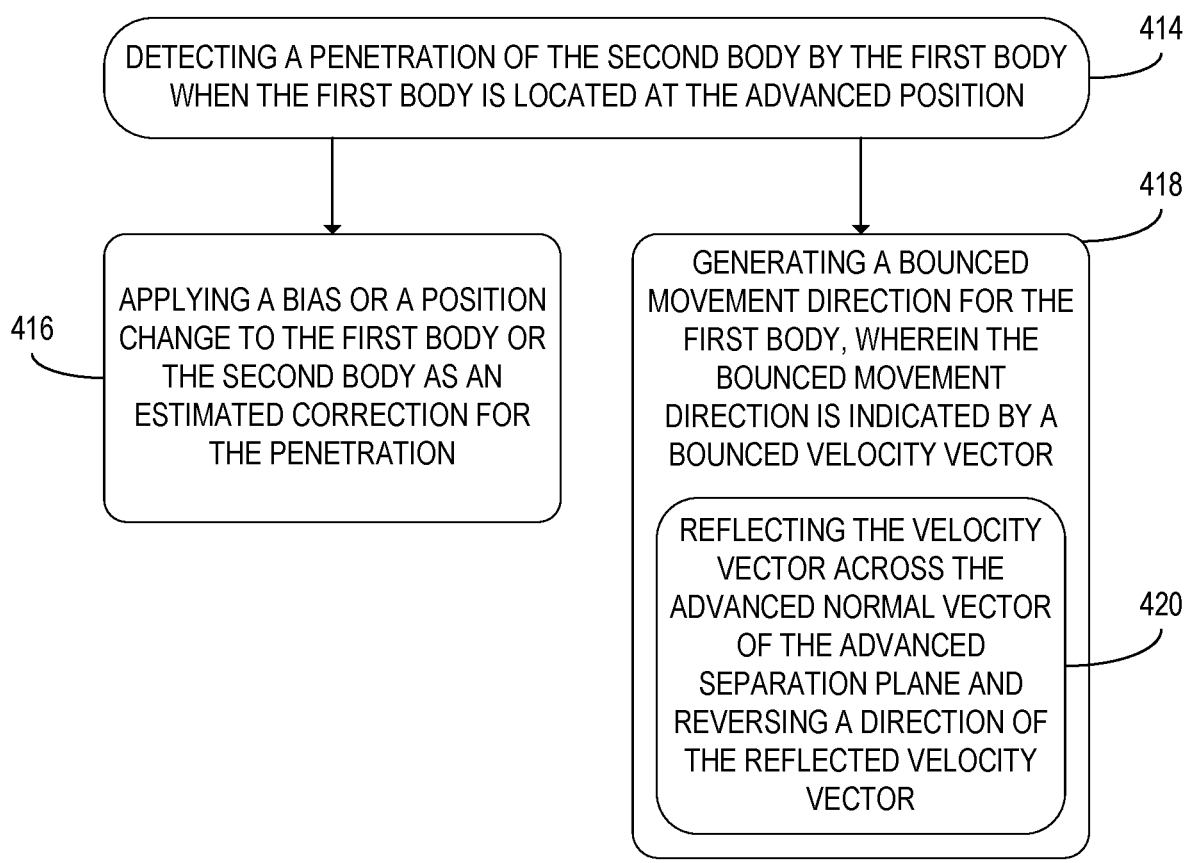
FIG. 7 shows optional steps that may be performed in the example method of FIG. 6.

FIG. 7 shows further steps of the method 400 that may be performed in some implementations. At step 414, the method 400 may further include detecting a penetration of the second body by the first body when the first body is located at the advanced position. In some embodiments, the first body may be moved to the new position despite the detection of the penetration. In such embodiments, the method 400 may further include, at step 416, applying a bias or a position change to the first body or the second body as an estimated correction for the penetration. The bias or position change may be applied in a single time step or over a plurality of time steps. In other embodiments, the method 400 may instead include, at step 418, generating a bounced movement direction for the first body. The bounced movement direction may be indicated by a bounced velocity vector. Step 418 may include step 420, at which the bounced velocity vector is generated by reflecting the velocity vector across the advanced normal vector of the advanced separation plane and reversing a direction of the reflected velocity vector. Alternatively, other techniques for generating the bounced velocity vector may be used, such as in simulations of inelastic collisions.

In some embodiments, the methods and processes described herein may be tied to a computing system of one or more computing devices. In particular, such methods and processes may be implemented as a computer-application program or service, an application-programming interface (API), a library, and/or other computer-program product.

Figure 8:
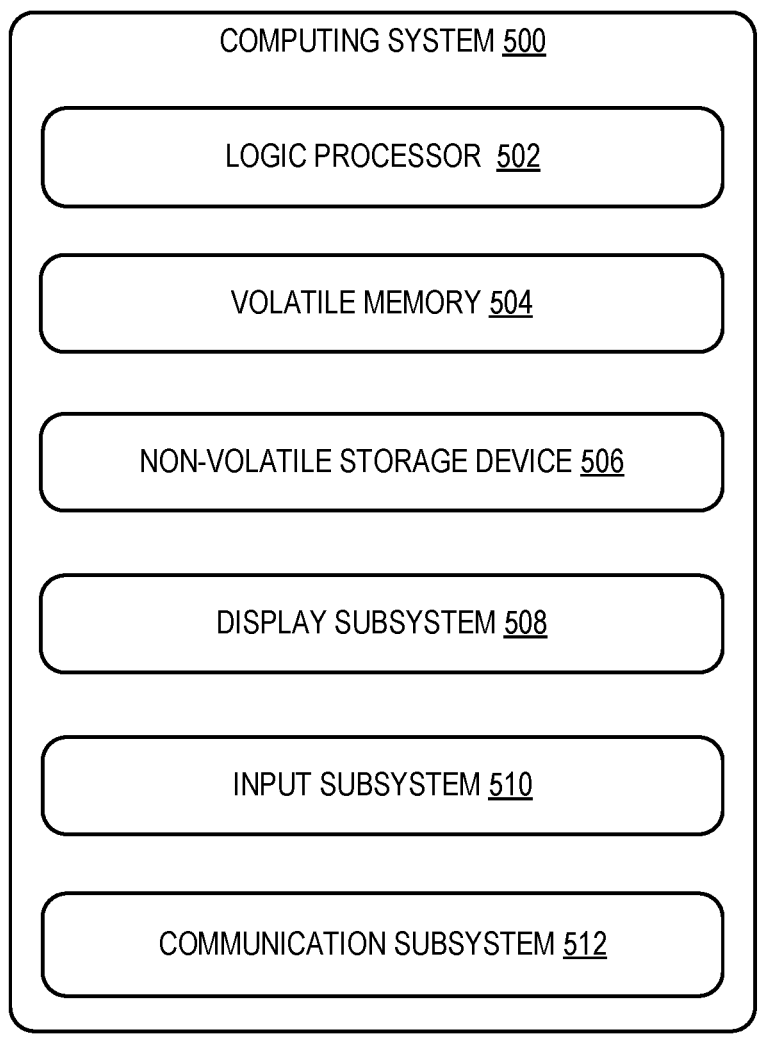
FIG. 8 shows a schematic depiction of an example computer device that may be used as the computing device of FIG. 1.

FIG. 8 schematically shows a non-limiting embodiment of a computing system 500 that can enact one or more of the methods and processes described above. Computing system 500 is shown in simplified form. Computing system 500 may embody the computing device 10. Computing system 500 may take the form of one or more personal computers, server computers, tablet computers, network computing devices, mobile computing devices, mobile communication devices (e.g., smart phone), and/or other computing devices.

Computing system 500 includes a logic processor 502 volatile memory 504, and a non-volatile storage device 506. Computing system 500 may optionally include a display subsystem 508, input subsystem 510, communication subsystem 512, and/or other components not shown in FIG. 8.

Logic processor 502 includes one or more physical devices configured to execute instructions. For example, the logic processor 502 may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 502 may include one or more physical processors (hardware) configured to execute software instructions. Additionally or alternatively, the logic processor 502 may include one or more hardware logic circuits or firmware devices configured to execute hardware-implemented logic or firmware instructions. Processors of the logic processor 502 may be single-core or multi-core, and the instructions executed thereon may be configured for sequential, parallel, and/or distributed processing. Individual components of the logic processor 502 optionally may be distributed among two or more separate devices, which may be remotely located and/or configured for coordinated processing. Aspects of the logic processor 502 may be virtualized and executed by remotely accessible, networked computing devices configured in a cloud-computing configuration. In such a case, it will be understood that these virtualized aspects are run on different physical logic processors of various different machines.

Non-volatile storage device 506 includes one or more physical devices configured to hold instructions executable by the logic processors to implement the methods and processes described herein. When such methods and processes are implemented, the state of non-volatile storage device 506 may be transformed—e.g., to hold different data.

Non-volatile storage device 506 may include physical devices that are removable and/or built-in. Non-volatile storage device 506 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 506 may include nonvolatile, dynamic, static, read/write, read-only, sequential-access, location-addressable, file-addressable, and/or content-addressable devices. It will be appreciated that non-volatile storage device 506 is configured to hold instructions even when power is cut to the non-volatile storage device 506.

Volatile memory 504 may include physical devices that include random access memory. Volatile memory 504 is typically utilized by logic processor 502 to temporarily store information during processing of software instructions. It will be appreciated that volatile memory 504 typically does not continue to store instructions when power is cut to the volatile memory 504. One example of volatile memory 504 is random access memory (RAM).

Aspects of logic processor 502, volatile memory 504, and non-volatile storage device 506 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 500 that is typically software stored in non-volatile memory and implemented by a processor to perform a particular function using portions of volatile memory 504, which function involves transformative processing that specially configures the processor to perform the function. Thus, a module, program, or engine may be instantiated via logic processor 502 executing instructions held by non-volatile storage device 506, using portions of volatile memory 504. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 508 may be used to present a visual representation of data held by non-volatile storage device 506. The visual representation may take the form of a graphical user interface (GUI). As the herein described methods and processes change the data held by the non-volatile storage device 506, and thus transform the state of the non-volatile storage device 506, the state of display subsystem 508 may likewise be transformed to visually represent changes in the underlying data. Display subsystem 508 may include one or more display devices utilizing virtually any type of technology. Such display devices may be combined with logic processor 502, volatile memory 504, and/or non-volatile storage device 506 in a shared enclosure, or such display devices may be peripheral display devices.

When included, input subsystem 510 may comprise or interface with one or more user-input devices such as a keyboard, mouse, touch screen, microphone, camera, or game controller. When included, communication subsystem 512 may be configured to communicatively couple various computing devices described herein with each other, and with other devices. Communication subsystem 512 may include wired and/or wireless communication devices compatible with one or more different communication protocols. As non-limiting examples, the communication subsystem 512 may be configured for communication via a wireless telephone network, or a wired or wireless local- or wide-area network. In some embodiments, the communication subsystem 512 may allow computing system 500 to send and/or receive messages to and/or from other devices via a network such as the Internet.

According to one aspect of the present disclosure, a computing device is provided, comprising a processor configured to execute a physics engine to simulate real-time rigid body dynamics of a simulated physical system including a plurality of bodies. The physics engine may be configured to, for a first body of the plurality of bodies, wherein the first body is located at a first position and has a movement direction indicated by a velocity vector, determine that a second position located along the velocity vector is located outside a first non-collision region for the first body and a second body of the plurality of bodies. The physics engine may be further configured to determine a safe position located along the velocity vector at which the first body would lie tangent to a first separation plane that bounds the first non-collision region on a first side. The physics engine may be further configured to determine an advanced position located along the velocity vector between the safe position and the second position. The physics engine may be further configured to determine an advanced separation plane that bounds an advanced non-collision region on an advanced side. The advanced separation plane may have an advanced normal vector based at least in part on the advanced position. The physics engine may be further configured to move the first body to a new position based at least in part on the velocity vector and the advanced separation plane.

According to this aspect, the advanced position may be located at an advancement distance from the safe position based at least in part on a radius of the first body. According to this aspect, the advancement distance is between 10% and 50% of the radius of the first body.

According to this aspect, the second position may be within the advanced non-collision region. The new position is the second position.

According to this aspect, the physics engine may be further configured to detect a penetration of the second body by the first body when the first body is located at the advanced position. According to this aspect, the physics engine may be further configured to apply a bias or a position change to the first body or the second body as an estimated correction for the penetration. According to this aspect, the physics engine may be further configured to generate a bounced movement direction for the first body. The bounced movement direction may be indicated by a bounced velocity vector. According to this aspect, the bounced velocity vector may be generated by reflecting the velocity vector across the advanced normal vector of the advanced separation plane and reversing a direction of the reflected velocity vector.

According to this aspect, the second position may be equal to the first position plus the velocity vector multiplied by a time step length.

According to this aspect, the first body and the second body may be convex.

According to another aspect of the present disclosure, a method for executing a physics engine to simulate real-time rigid body dynamics of a simulated physical system including a plurality of bodies is provided. The method may comprise, for a first body of the plurality of bodies, wherein the first body is located at a first position and has a movement direction indicated by a velocity vector, determining that a second position located along the velocity vector is located outside a first non-collision region for the first body and a second body of the plurality of bodies. The method may further comprise determining a safe position located along the velocity vector at which the first body would lie tangent to a first separation plane that bounds the first non-collision region on a first side. The method may further comprise determining an advanced position located along the velocity vector between the safe position and the second position. The method may further comprise determining an advanced separation plane that bounds an advanced non-collision region on an advanced side. The advanced separation plane may have an advanced normal vector based at least in part on the advanced position. The method may further comprise moving the first body to a new position based at least in part on the velocity vector and the advanced separation plane.

According to this aspect, the advanced position may be located at an advancement distance from the safe position based at least in part on a radius of the first body. According to this aspect, the advancement distance may be between 10% and 50% of the radius of the first body.

According to this aspect, the second position may be within the advanced non-collision region. The new position may be the second position.

According to this aspect, the method may further comprise detecting a penetration of the second body by the first body when the first body is located at the advanced position. According to this aspect, the method may further comprise applying a bias or a position change to the first body or the second body as an estimated correction for the penetration. According to this aspect, the method may further comprise generating a bounced movement direction for the first body. The bounced movement direction may be indicated by a bounced velocity vector. According to this aspect, the bounced velocity vector may be generated by reflecting the velocity vector across the advanced normal vector of the advanced separation plane and reversing a direction of the reflected velocity vector.

According to this aspect, the second position may be equal to the first position plus the velocity vector multiplied by a time step length.

According to another aspect of the present disclosure, a computing device is provided, comprising a processor configured to execute a physics engine to simulate real-time rigid body dynamics of a simulated physical system including a plurality of bodies. The physics engine may be configured to, for a first body of the plurality of bodies, wherein the first body is located at a first position and has a movement direction indicated by a velocity vector, determine that a second position located along the velocity vector is located outside a first non-collision region for the first body and a second body of the plurality of bodies. The second position may be equal to the first position plus the velocity vector multiplied by a time step length. The physics engine may be further configured to determine a safe position located along the velocity vector at which the first body would lie tangent to a first separation plane that bounds the first non-collision region on a first side. The physics engine may be further configured to determine an advanced position located along the velocity vector between the safe position and the second position. The physics engine may be further configured to determine an advanced separation plane that bounds an advanced non-collision region on an advanced side. The advanced separation plane may have an advanced normal vector based at least in part on the advanced position. The physics engine may be further configured to move the first body to the second position based at least in part on the velocity vector and the advanced separation plane. The second position may be within the advanced non-collision region.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device, comprising:
a processor configured to execute a physics engine to simulate real-time rigid body dynamics of a simulated physical system including a plurality of bodies, the physics engine being configured to:
for a first body of the plurality of bodies, wherein the first body is located at a first position and has a movement direction indicated by a velocity vector, determine that a second position located along the velocity vector is located outside a first non-collision region for the first body and a second body of the plurality of bodies;
determine a safe position located along the velocity vector at which the first body would lie tangent to a first separation plane that bounds the first non-collision region on a first side of the first non-collision region;
determine an advanced position located along the velocity vector between the safe position and the second position, wherein the advanced position is located at an advancement distance along the velocity vector from the safe position;
determine an advanced separation plane that bounds an advanced non-collision region on an advanced side of the advanced non-collision region, wherein the advanced separation plane is specified by an advanced normal vector based at least in part on the advanced position; and
move the first body to a new position based at least in part on the velocity vector and the advanced separation plane.

2. The computing device of claim 1, wherein the advanced position is located at the advancement distance from the safe position based at least in part on a radius of the first body.

3. The computing device of claim 2, wherein the advancement distance is between 10% and 50% of the radius of the first body.

4. The computing device of claim 1, wherein the second position is within the advanced non-collision region, and wherein the new position is the second position.

5. The computing device of claim 1, wherein the physics engine is further configured to detect a penetration of the second body by the first body when the first body is located at the advanced position.

6. The computing device of claim 5, wherein the physics engine is further configured to apply a bias or a position change to the first body or the second body as an estimated correction for the penetration.

7. The computing device of claim 5, wherein the physics engine is further configured to generate a bounced movement direction for the first body, wherein the bounced movement direction is indicated by a bounced velocity vector.

8. The computing device of claim 7, wherein the bounced velocity vector is generated by reflecting the velocity vector across the advanced normal vector of the advanced separation plane and reversing a direction of the reflected velocity vector.

9. The computing device of claim 1, wherein the second position is equal to the first position plus the velocity vector multiplied by a time step length.

10. The computing device of claim 1, wherein the first body and the second body are convex.

11. A method for executing a physics engine to simulate real-time rigid body dynamics of a simulated physical system including a plurality of bodies, the method comprising:
   for a first body of the plurality of bodies, wherein the first body is located at a first position and has a movement direction indicated by a velocity vector, determining that a second position located along the velocity vector is located outside a first non-collision region for the first body and a second body of the plurality of bodies;
   determining a safe position located along the velocity vector at which the first body would lie tangent to a first separation plane that bounds the first non-collision region on a first side of the first non-collision region;
   determining an advanced position located along the velocity vector between the safe position and the second position, wherein the advanced position is located at an advancement distance along the velocity vector from the safe position;
   determining an advanced separation plane that bounds an advanced non-collision region on an advanced side of the advanced non-collision region, wherein the advanced separation plane is specified by an advanced normal vector based at least in part on the advanced position; and
   moving the first body to a new position based at least in part on the velocity vector and the advanced separation plane.

12. The method of claim 11, wherein the advanced position is located at the advancement distance from the safe position based at least in part on a radius of the first body.

13. The method of claim 12, wherein the advancement distance is between 10% and 50% of the radius of the first body.

14. The method of claim 11, wherein the second position is within the advanced non-collision region, and wherein the new position is the second position.

15. The method of claim 11, further comprising detecting a penetration of the second body by the first body when the first body is located at the advanced position.

16. The method of claim 15, further comprising applying a bias or a position change to the first body or the second body as an estimated correction for the penetration.

17. The method of claim 15, further comprising generating a bounced movement direction for the first body, wherein the bounced movement direction is indicated by a bounced velocity vector.

18. The method of claim 17, wherein the bounced velocity vector is generated by reflecting the velocity vector across the advanced normal vector of the advanced separation plane and reversing a direction of the reflected velocity vector.

19. The method of claim 11, wherein the second position is equal to the first position plus the velocity vector multiplied by a time step length.

20. A computing device, comprising:
   a processor configured to execute a physics engine to simulate real-time rigid body dynamics of a simulated physical system including a plurality of bodies, the physics engine being configured to:
      for a first body of the plurality of bodies, wherein the first body is located at a first position and has a movement direction indicated by a velocity vector, determine that a second position located along the velocity vector is located outside a first non-collision region for the first body and a second body of the plurality of bodies, wherein the second position is equal to the first position plus the velocity vector multiplied by a time step length;
      determine a safe position located along the velocity vector at which the first body would lie tangent to a first separation plane that bounds the first non-collision region on a first side of the first non-collision region;
      determine an advanced position located along the velocity vector between the safe position and the second position, wherein the advanced position is located at an advancement distance along the velocity vector from the safe position;
      determine an advanced separation plane that bounds an advanced non-collision region on an advanced side of the advanced non-collision region, wherein the advanced separation plane is specified by an advanced normal vector based at least in part on the advanced position; and
      move the first body to the second position based at least in part on the velocity vector and the advanced separation plane, wherein the second position is within the advanced non-collision region.

* * * * *